US012804930B2

(12) United States Patent
Li et al.

(10) Patent No.: US 12,804,930 B2
(45) Date of Patent: Nov. 17, 2026

(54) METHOD FOR FABRICATING GATE-ALL-AROUND (GAA) STRUCTURE

(71) Applicants: Peking University, Beijing (CN); Beijing Intellectual Property Operation Management Co., LTD, Beijing (CN)

(72) Inventors: Ming Li, Beijing (CN); Ran Bi, Beijing (CN)

(73) Assignees: Peking University, Beijing (CN); Beijing Intellectual Property Operation Management Co., LTD., Beijing (CN)

( * ) Notice: Subject to any disclaimer, the term of this patent is extended or adjusted under 35 U.S.C. 154(b) by 426 days.

(21) Appl. No.: 18/446,437

(22) Filed: Aug. 8, 2023

(65) Prior Publication Data

US 2023/0387249 A1 Nov. 30, 2023

(30) Foreign Application Priority Data

Oct. 27, 2022 (CN) ......................... 202211323489.7

(51) Int. Cl.
*H10D 30/01* (2025.01)
*H10D 30/67* (2025.01)
(Continued)

(52) U.S. Cl.
CPC ......... *H10D 30/014* (2025.01); *H10D 30/019* (2025.01); *H10D 30/022* (2025.01); *H10D 30/6735* (2025.01); *H10D 62/118* (2025.01); *H10D 62/121* (2025.01); *H10D 64/015* (2025.01); *H10D 64/017* (2025.01); *H10D 64/018* (2025.01); *H10P 14/6349* (2026.01)

(58) Field of Classification Search
CPC ........ H10D 30/014–0198; H10D 30/501–509; H10D 30/797; H10D 64/015–018; H10D 84/832–833; H10D 84/851–852; H10D 84/0126–0195; H10D 30/6735; H10D 30/6744; H10P 14/3462; H10P 14/6349
See application file for complete search history.

(56) References Cited

U.S. PATENT DOCUMENTS 6,054,355 A 4/2000 Inumiya et al.
9,502,310 B1 * 11/2016 Li ........................ H10D 84/017
(Continued)

FOREIGN PATENT DOCUMENTS

CN 115274448 A 11/2022

*Primary Examiner* — Christine S. Kim
*Assistant Examiner* — Tien Tran

(57) ABSTRACT

A method for fabricating a gate-all-around (GAA) structure, including: etching a superlattice laminate to form active regions; performing selective epitaxy growth of a silicon germanium (SiGe) layer to form a SiGe-wrapped Si nanosheet stacked structure, where the SiGe layer and the SiGe/Silicon (Si) periodic superlattice laminate have the same germanium (Ge) content; after silicon oxide is back-filled and chemical mechanical polishing (CMP) is performed on the active regions, performing an amorphous-silicon dummy-gate process on a top of the active regions; removing dummy gate, and selectively etching the SiGe layer; and forming hole-trench structures connected with trenches of the dummy gate around the Si nanosheet stacked structure.

13 Claims, 52 Drawing Sheets

B-B'

(51) Int. Cl.

| | |
|---|---|
| ***H10D 62/10*** | (2025.01) |
| ***H10D 64/01*** | (2025.01) |
| ***H10P 14/60*** | (2026.01) |

(56) References Cited

U.S. PATENT DOCUMENTS

| | | | | |
|---|---|---|---|---|
| 10,872,818 | B2 * | 12/2020 | Chiang | H01L 21/76831 |
| 2019/0051744 | A1 * | 2/2019 | Coquand | H10D 62/834 |
| 2020/0075720 | A1 * | 3/2020 | Cheng | H10D 64/68 |
| 2022/0352180 | A1 * | 11/2022 | Lin | H01L 21/28088 |
| 2022/0384609 | A1 * | 12/2022 | Lin | H10D 64/018 |
| 2023/0395681 | A1 * | 12/2023 | Liu | H10D 30/014 |

* cited by examiner

B-B'

B-B'

B-B'

A-A'

B-B'

(a)

A-A'

B-B'

(a)

(a)

B-B'

A-A'

B-B'

(a)

A-A'

(a)

A-A'

B-B'

A-A'

B-B'

(a)

A-A'

B-B'

METHOD FOR FABRICATING GATE-ALL-AROUND (GAA) STRUCTURE

CROSS-REFERENCE TO RELATED APPLICATIONS

This application claims the benefit of priority from Chinese Patent Application No. 202211323489.7, filed on Oct. 27, 2022. The content of the aforementioned application, including any intervening amendments thereto, is incorporated herein by reference in its entirety.

TECHNICAL FIELD

This application relates to manufacturing of ultra-large-scale integrated circuits, and more particularly to a method for fabricating a gate-all-around (GAA) structure.

BACKGROUND

Gate-all-around (GAA) electrical devices are critical structures in the fabrication of very large-scale integrated circuits (VLSI) at the 3 nm node and below. The fabrication process of the GAA device mainly includes: growth of silicon germanium (SiGe)/silicon (Si) superlattice, pattern etching in active region, patterning and etching of amorphous silicon (a-Si) dummy gate, etch back of source and drain regions, formation of inner spacer, selective epitaxy on source and drain regions, removal of dummy gate and filling of high-K metal gate (HKMG).

During the patterning and etching of the dummy gate, the large aspect ratio will lead to inconsistency in lengths of the upper and lower gates and large roughness in the pattern edge. In the removal of the dummy gate, the high-aspect-ratio etching process will easily cause damage to the side-wall of the superlattice Fin. When filling the metal gate in the dummy gate trench, the high-resistance titanium nitride is the predominant part. Moreover, there is a parasitic capacitance between the side wall of the dummy-gate trench and the parallel metal gate adjacent thereto, and between its Fin side walls.

In order to improve the gate length consistency of nanosheet devices, reduce the channel edge roughness, and enhance the performance of nanosheet devices, it is urgently required to develop a process for fabricating a low-aspect-ratio dummy gate.

SUMMARY

An objective of this application is to provide a method for fabricating a gate-all-around (GAA) structure. In this method, after the active region of a superlattice is etched, the selective epitaxy growth (SEG) of a SiGe layer (the SiGe layer has the same Ge level with the SiGe superlattice) is performed to form a SiGe stacked structure, and after the backfilling of silicon oxide and chemical mechanical polishing (CMP), an amorphous-silicon dummy-gate CMP process is conducted on a flat top to reduce the aspect ratio of the dummy gate, so as to effectively improve the patterning uniformity of dummy gate and edge roughness, and avoid damage to the sidewall of the active region.

Technical solutions of this application are described as follows.

This application provides a method for fabricating a gate-all-around (GAA) structure, comprising:

(A) forming a silicon germanium (SiGe)/silicon (Si) periodic superlattice laminate on a substrate;

(B) forming at least two active regions on the SiGe/Si periodic superlattice laminate by patterning;

(C) forming an isolation structure between the at least two active regions;

(D) performing selective epitaxy growth of a SiGe layer on the at least two active regions to form a SiGe-wrapped stacked structure; wherein the SiGe layer and a SiGe superlattice in the SiGe/Si periodic superlattice laminate have the same germanium (Ge) content;

(E) depositing a layer of a first dielectric material, and polishing a top of the layer of the first dielectric material;

(F) forming a dummy gate pattern on the top of the layer of the first dielectric material through steps of:

(F1) depositing a dummy-gate material on the top of the layer of the first dielectric material, wherein a ratio of an etch rate of the dummy-gate material to an etch rate of Si and SiGe in dry etching or wet etching is greater than 5:1; and (F2) defining the dummy-gate pattern by photoetching and etching; wherein a width of the dummy-gate pattern defines a gate length of a nanosheet device;

(G) performing doping in a source-drain extension region through steps of:

(G1) taking the dummy-gate pattern as a mask, removing the first dielectric material exposed on a top of the at least two active regions by anisotropic etching; and (G2) taking the dummy-gate pattern as the mask, performing doping and activation in the source-drain extension region of the at least two active regions;

(H) forming a gate spacer structure through steps of:

(H1) isotropically depositing a layer of a second dielectric material; and (H2) performing maskless etching through anisotropic etching to form the gate spacer structure on each side of the dummy-gate pattern;

(I) performing source-drain etch back through steps of:

(I1) depositing a layer of a third dielectric material as an etching mask to protect the dummy gate and the gate spacer structure;

(I2) exposing a source-drain etch-back window by photoetching;

(I3) removing exposed SiGe/Si periodic superlattice laminate by anisotropic etching to complete the etch back of the source and the drain; and (I4) removing the third dielectric material;

(J) forming an inner spacer through steps of:

(J1) selectively etching the SiGe layer by isotropic etching, wherein an etching depth of the SiGe layer is equal to a thickness of the gate spacer structure;

(J2) isotropically depositing a layer of a fourth dielectric material; wherein a thickness of the layer of the fourth dielectric material is greater than the etching depth of the SiGe layer; and (J3) removing exposed parts of the layer of the fourth dielectric material by anisotropic etching to form the inner spacer;

(K) forming a source-drain structure by selective epitaxy and in-situ doping;

(L) depositing a first interlayer dielectric material, and exposing the dummy gate through chemical mechanical polishing (CMP);

(M) removing a dummy gate and forming a high-k metal gate (HKMG);

(N) depositing a second interlayer dielectric material, and forming a gate-end contact hole, a source-end contact hole, a drain-end contact hole and a bulk-end contact hole; and filling Metal 0 in the gate-end contact hole, the source-end contact hole, the drain-end contact hole and the bulk-end contact hole by sputtering; and (O) performing a back-end-of-line (BEOL) process to complete device integration.

In an embodiment, step (B) is performed through steps of:

(B1) depositing a layer of a hard mask material;

(B2) patterning the layer of the hard mask material by photoetching to form a pattern whose shape and size respectively defines a shape and a size of each of the at least two active regions; and (B3) etching the SiGe/Si periodic superlattice laminate and the substrate by anisotropic etching to form the at least two active regions;

wherein a ratio of an etch rate of the hard mask material in step (B2) to an etch rate of Si and SiGe is greater than 5:1.

In an embodiment, step (E) is performed through steps of:

(E1) removing the hard mask material;

(E2) depositing the layer of the first dielectric material on the at least two active regions, wherein a thickness of the layer of the first dielectric material is greater than a height of the at least two active regions;

(E3) polishing the layer of the first dielectric material by CMP; and (E4) reducing the thickness of the layer of the first dielectric material by anisotropic etching, wherein the thickness of the layer of the first dielectric material is always kept greater than the height of the at least two active regions.

In an embodiment, step (M) is performed through steps of:

(M1) selectively removing an exposed part of the dummy gate and a polished layer of the first dielectric material at a bottom thereof;

(M2) selectively removing an exposed part of the SiGe layer; and (M3) isotropically depositing a gate dielectric material, a work-function metal and a gate metal material sequentially.

In an embodiment, the substrate is a bulk-silicon substrate or a silicon-insulator-silicon (SOI) substrate.

In an embodiment, in step (A), individual $Si_{1-x}Ge_x$ layers in the SiGe/Si periodic superlattice laminate have the same x value.

In an embodiment, in step (C), for the bulk-silicon substrate, the isolation structure is formed by combination of well and shallow trench; and for the SOI substrate, the isolation structure is formed by shallow trench.

In an embodiment, in step (H), the gate oxide layer is made of a high-k (HK) dielectric material, and is formed by atomic layer deposition (ALD).

In an embodiment, in step (N), the Metal 0 is tungsten (W) or copper (Cu).

Compared with the prior art, this application has the following beneficial effects.

(1) In the existing method, the gate structure is defined through the polycrystalline/amorphous silicon dummy gate lines. Compared with the existing method, the method provided herein reduces the aspect ratio of the dummy gate lines, which effectively reduces the impact on the channel surface during the removal of the dummy gate while ensuring the length consistency of the upper layer gate and the lower layer gate of the nanosheet device, and improves the device performance.

(2) The method provided herein can effectively reduce the high-resistance metal area through the all-around gate defined by the epitaxial SiGe, thereby reducing the parasitic capacitance between the metal resistance and the gate lines, and thus improving the circuit speed.

BRIEF DESCRIPTION OF THE DRAWINGS

FIGS. 1-17 are schematic diagrams of key processes in the fabrication of a gate-all-around (GAA) structure provided in the following embodiments of this application.

In FIGS. 1-17, a is a top view, b is a sectional view along A-A' line in a, and c is a sectional view along B-B' line in a;

DETAILED DESCRIPTION OF EMBODIMENTS

This application will be described in detail below with reference to the accompanying drawings and embodiments.

This application provides a method for fabricating a gate-all-around (GAA) structure, which was performed as follows.

Figure 1A:
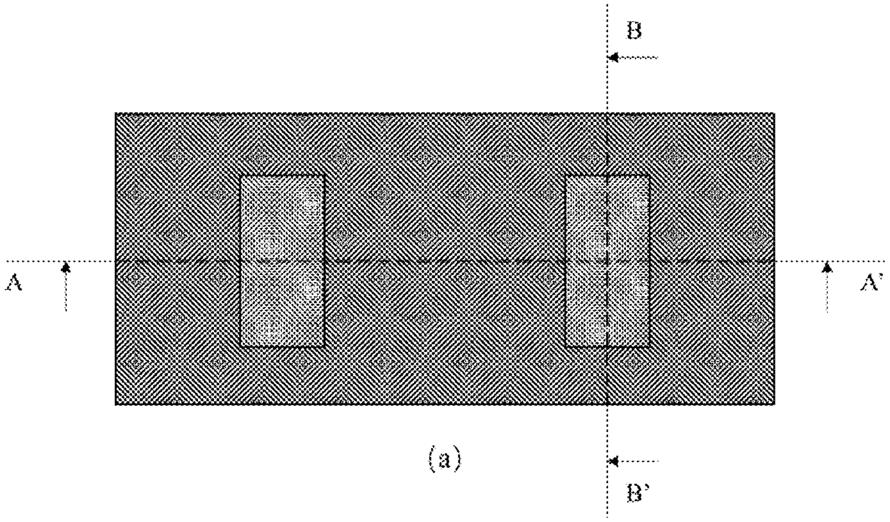
FIGS. 1*a-c* schematically show growth of superlattice laminate on a substrate and patterning of hard mask to define active regions.
Figure 1B:
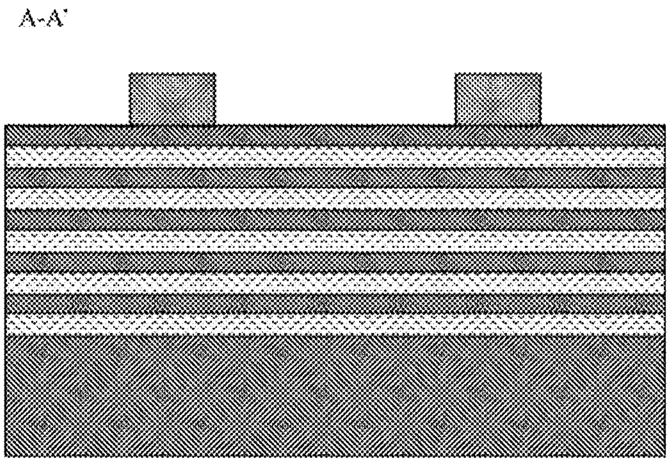
Figure 1C:
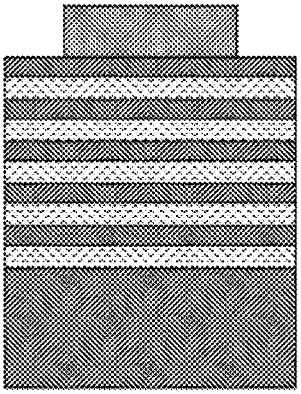

(1) A silicon germanium (SiGe)/silicon (Si) periodic superlattice laminate was formed on a (100) bulk silicon substrate by epitaxy. A thickness of the SiGe layer in the SiGe/Si periodic superlattice laminate was 15 nm, and a thickness of the Si layer in the SiGe/Si periodic superlattice laminate was 8 nm, as shown in FIG. 1.

(2) A $Si_3N_4$ layer was deposited on the SiGe/Si periodic superlattice laminate as an etching hard mask by plasma enhanced chemical vapor deposition (PECVD). A $SiO_2$ layer was employed as a stress buffer layer between the $Si_3N_4$ layer and the SiGe/Si periodic superlattice laminate. The $Si_3N_4$ layer was patterned through photoetching and etching.

Figure 2A:
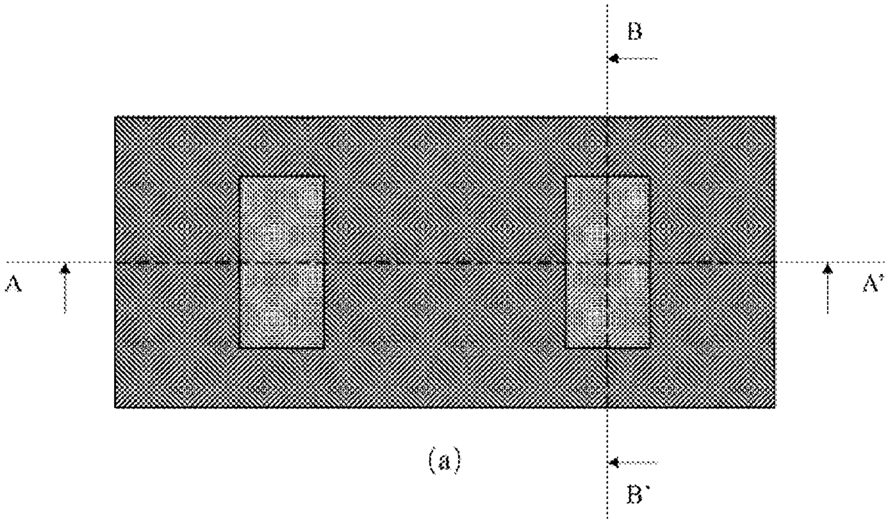
FIGS. 2*a-c* schematically show formation of active regions by patterning.
Figure 2B:
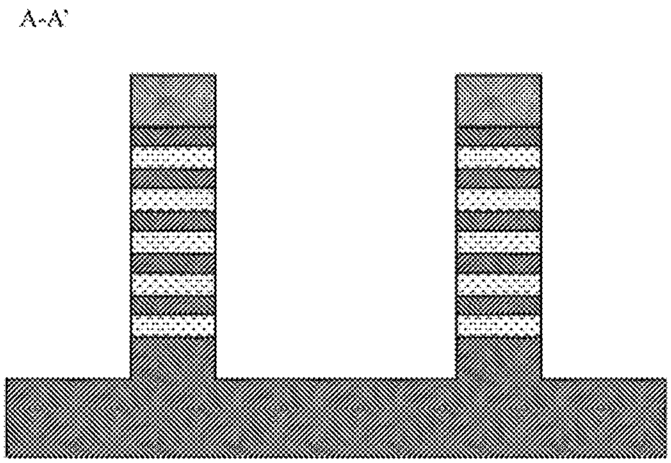
Figure 2C:
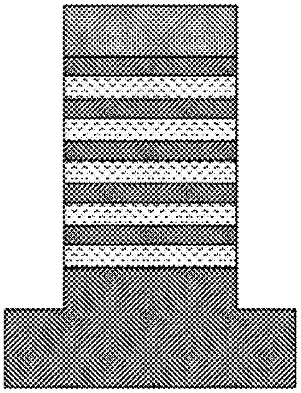

(3) The SiGe/Si periodic superlattice laminate was etched by taking the $Si_3N_4$ layer as the hard mask to define patterns of active regions, as shown in FIG. 2.

Figure 3A:
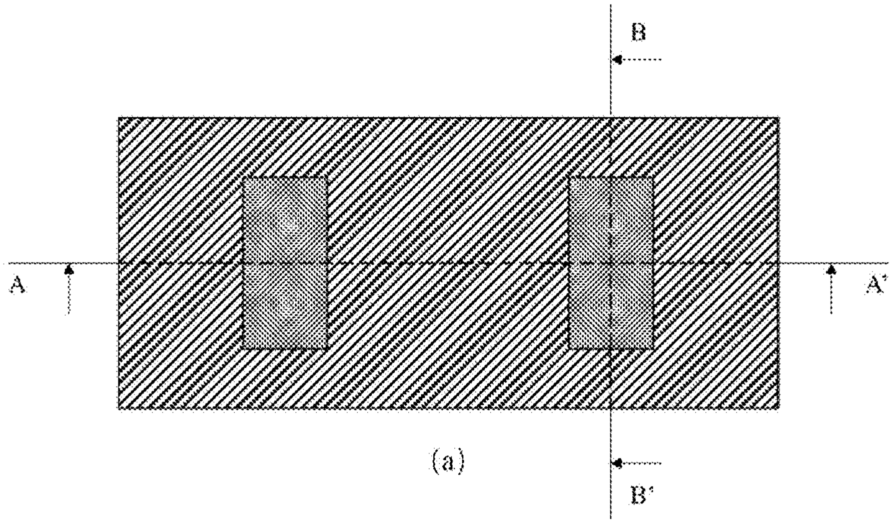
FIGS. 3*a-c* schematically show formation of isolation structure between active regions.
Figure 3B:
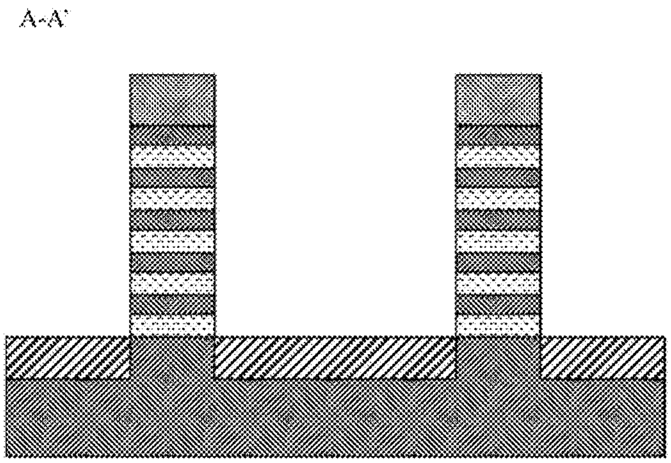
Figure 3C:
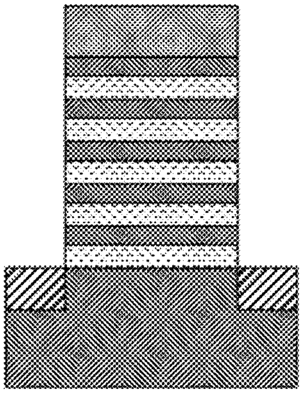

(4) A $SiO_2$ layer was deposited on the SiGe/Si periodic superlattice laminate by using PECVD, and then subjected to chemical mechanical polishing (CMP), until the $Si_3N_4$ layer was exposed. The $SiO_2$ layer was subjected to etch back to a surface of the bulk silicon substrate by dry etching to form shallow trench isolation (STI), as shown in FIG. 3.

Figure 4A:
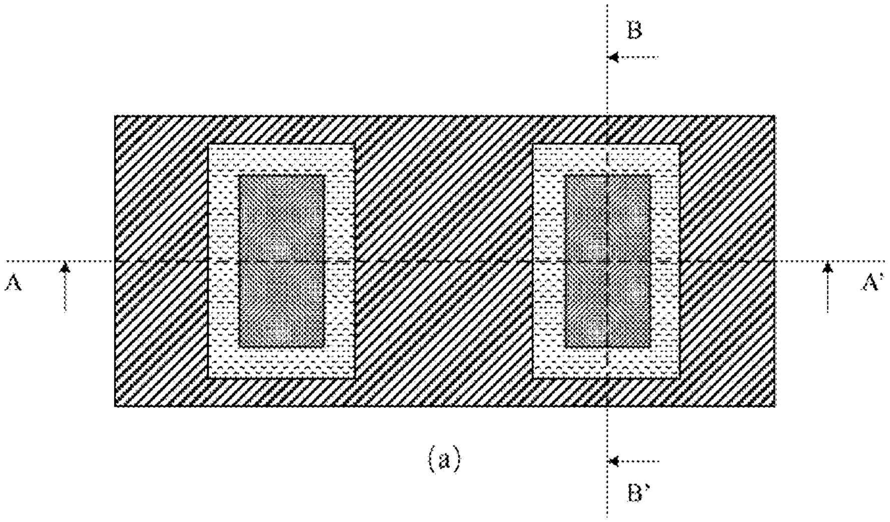
FIGS. 4*a-c* schematically show selective epitaxy growth of a silicon germanium (SiGe) layer on a semiconductor material, where the SiGe layer and a SiGe superlattice in the SiGe/Si periodic superlattice laminate have the same germanium (Ge) content FIGS. 5*a-c* schematically show deposition of an interlayer dielectric and chemical mechanical polishing (CMP), etch back and thickness reduction of the interlayer dielectric.
Figure 4B:
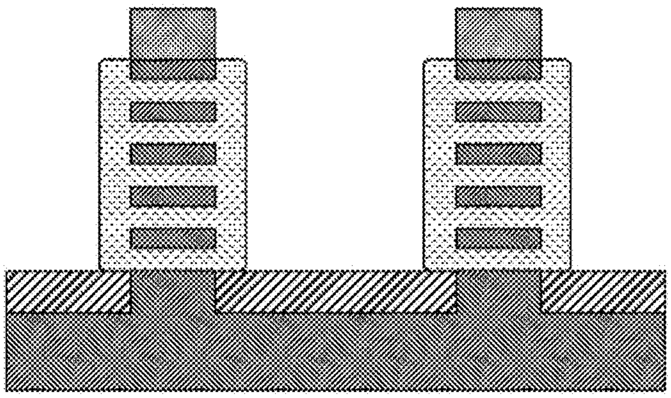
Figure 4C:
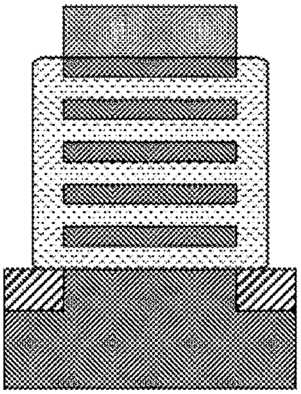

(5) A single-crystal SiGe layer was grown on a surface of the Si layer and the SiGe layer by selective epitaxy. The single-crystal SiGe layer and a SiGe superlattice in the SiGe/Si periodic superlattice laminate have the same germanium (Ge) content, as shown in FIG. 4.

Figure 5A:
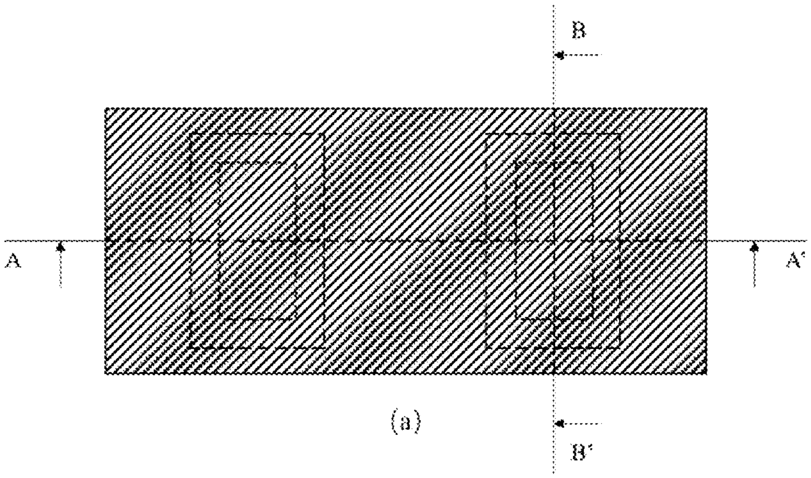
Figure 5B:
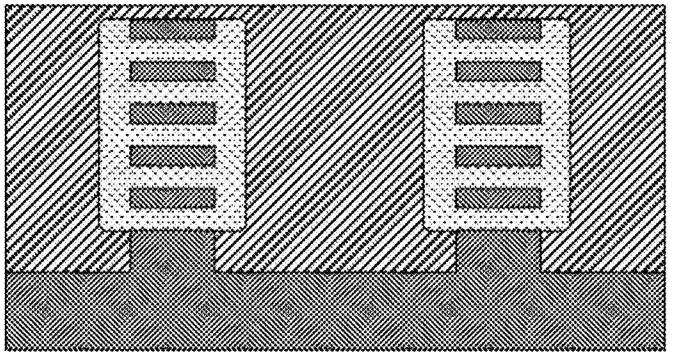
Figure 5C:
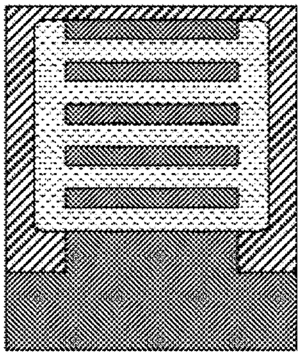
Figure 6A:
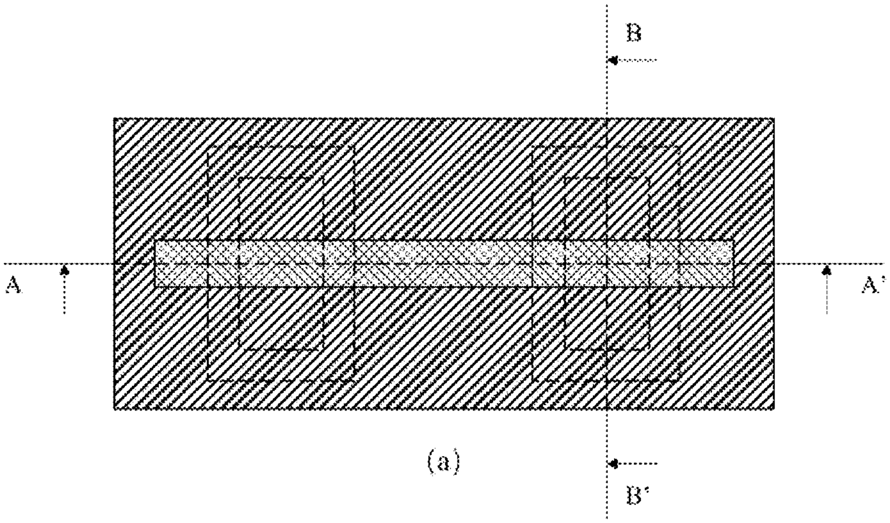
FIGS. 6*a-c* schematically show deposition and patterning of a dummy-gate material.
Figure 6B:
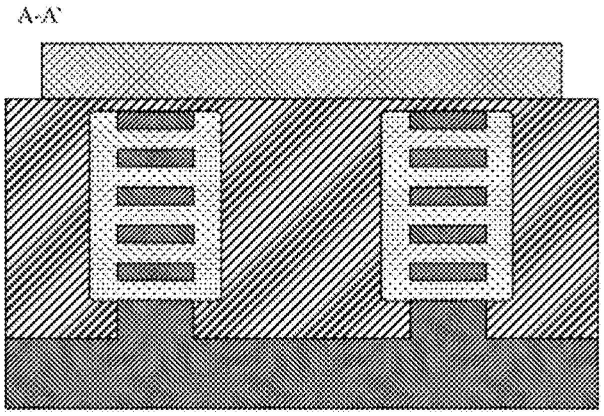
Figure 6C:
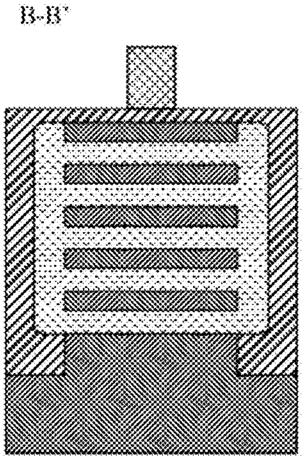

(6) The active regions were respectively covered with a $SiO_2$ layer through PECVD, and then flattened by CMP. After that, the $SiO_2$ layer on the active regions was back etched to reduce the thickness. A distance between the surface of the $SiO_2$ layer and the surface of the SiGe/Si periodic superlattice laminate was about 10 nm, as shown in FIG. 5;

(7) Amorphous Silicon (a-Si) (80 nm) was deposited on the silicon layer by PECVD. A pattern of a dummy gate was defined by photoetching, as shown in FIG. 6.

(8) Taking the dummy gate as a mask, the exposed $SiO_2$ was anisotropically removed through dry etching to expose the surface of the SiGe/Si periodic superlattice laminate.

(9) A $SiO_2$ (1 nm) was deposited on a surface of the amorphous silicon by rapid thermal oxidation. A source-drain extension region was doped and activated through Spike activation through ion injection.

Figure 7A:
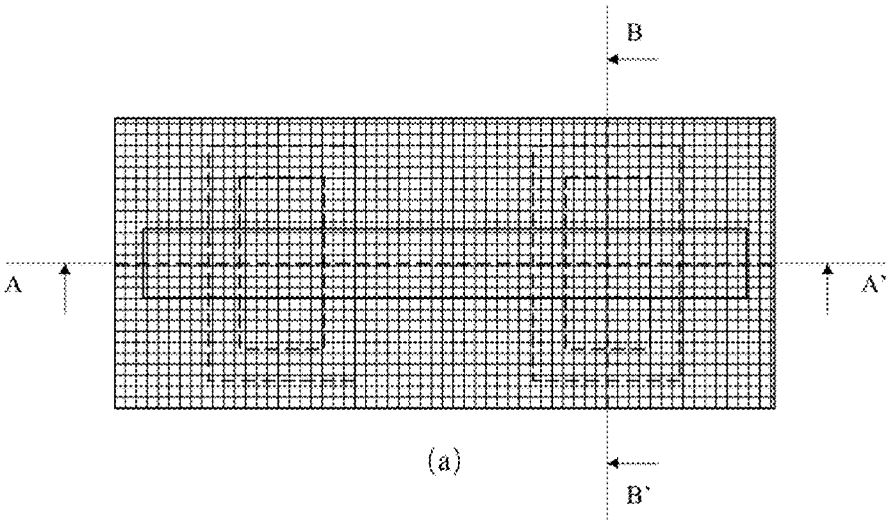
FIGS. 7*a-c* schematically show deposition of a gate-spacer material.
Figure 7B:
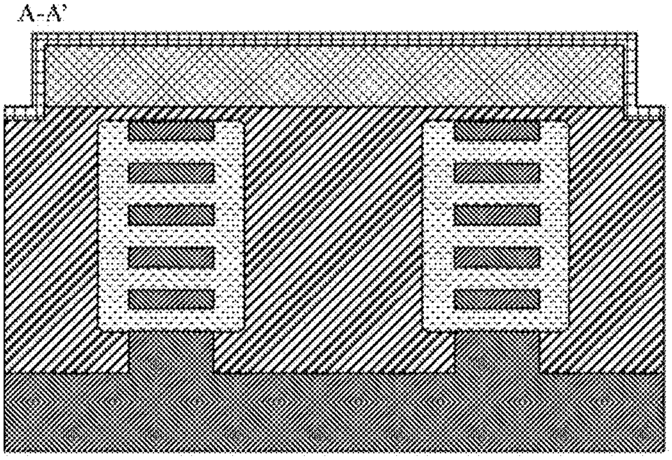
Figure 7C:
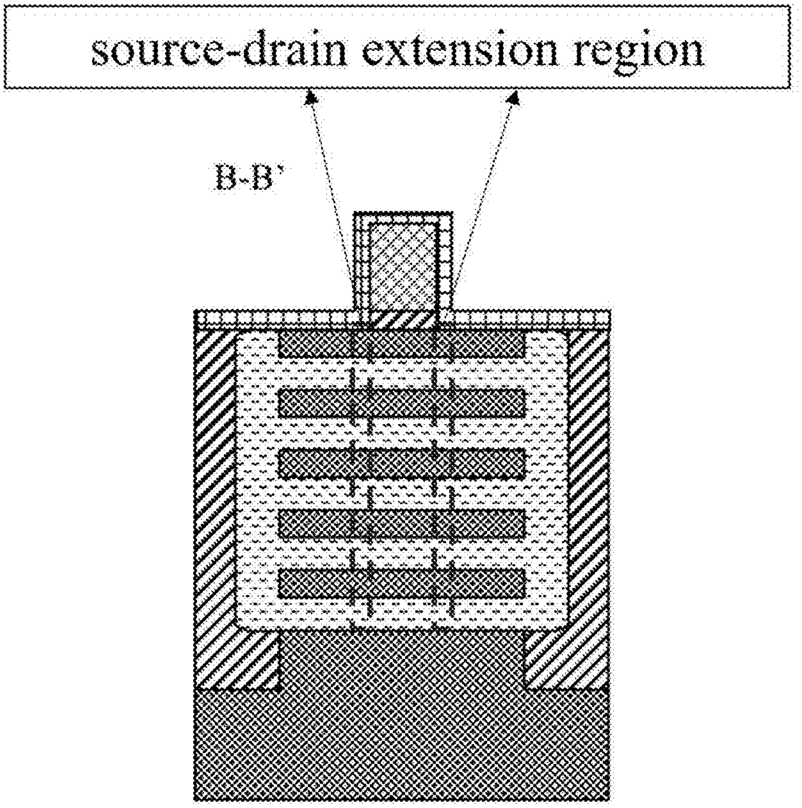
Figure 8A:
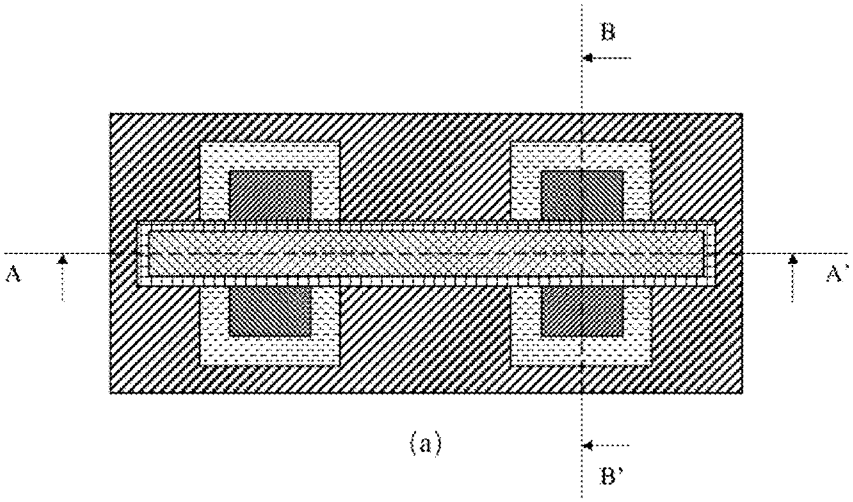
FIGS. 8*a-c* schematically show maskless etching to form the gate spacer structure.
Figure 8B:
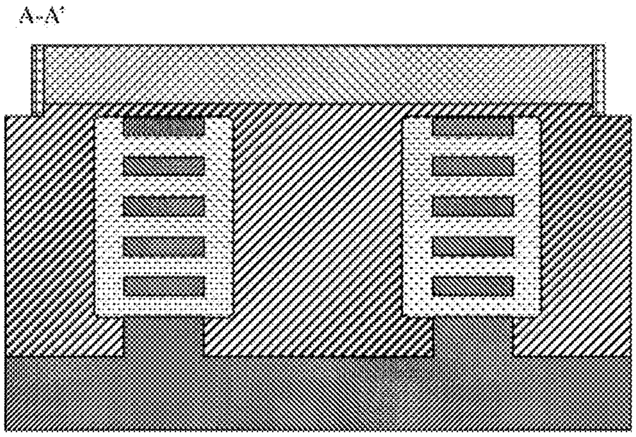
Figure 8C:
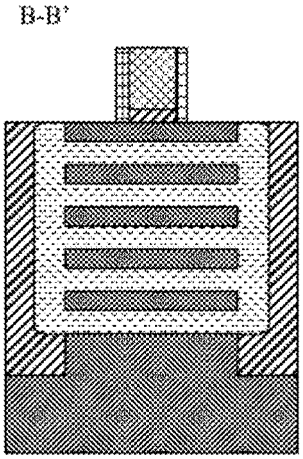

(10) A $Si_3N_4$ layer (50 nm) was deposited on the $SiO_2$ (1 nm) by PECVD, as shown in FIG. 7. A gate spacer structure was formed by maskless etching, as shown in FIG. 8.

Figure 9A:
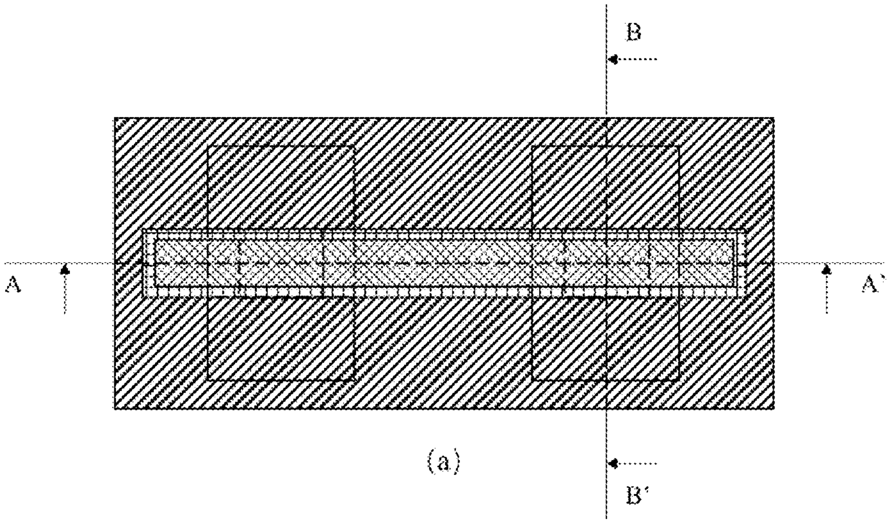
FIGS. 9*a-c* schematically show source-drain etch back.
Figure 9B:
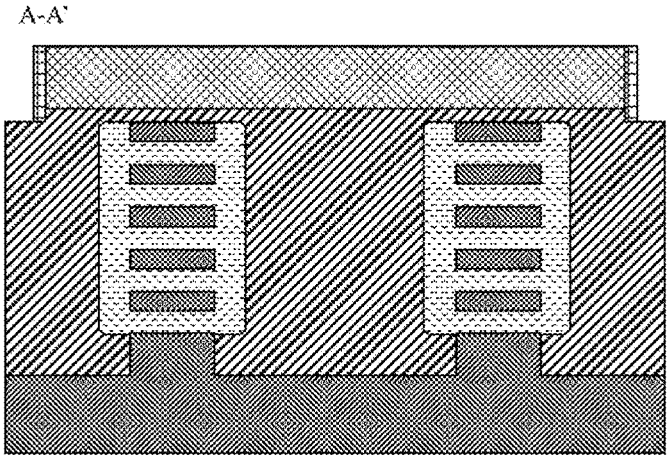
Figure 9C:
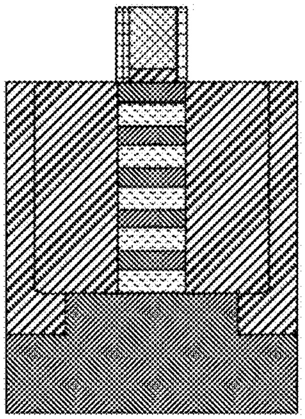

(11) A layer of the hard mask material was deposited on the $Si_3N_4$ layer (50 nm) and patterned to protect the dummy gate and the gate spacer structure. Exposed source and drain were subjected to etch back, as shown in FIG. 9.

Figure 10A:
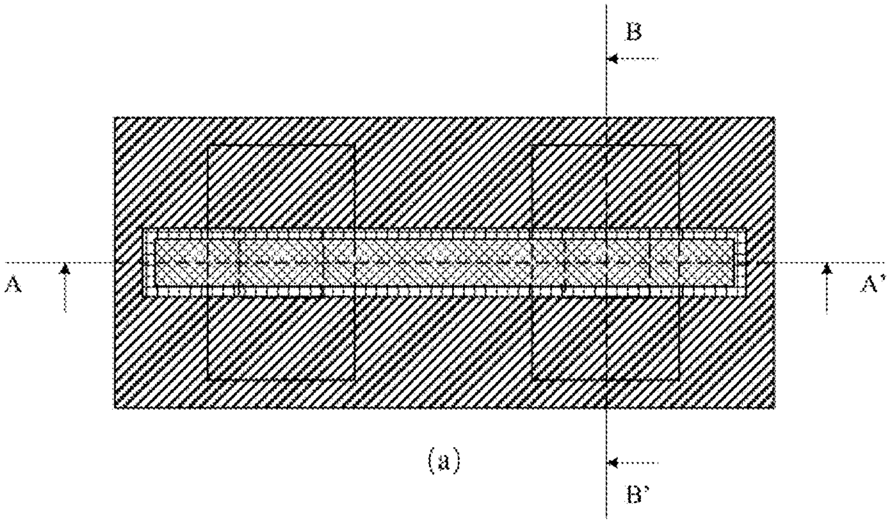
FIGS. 10*a-c* schematically show selective etching of SiGe to form inner spacer.
Figure 10B:
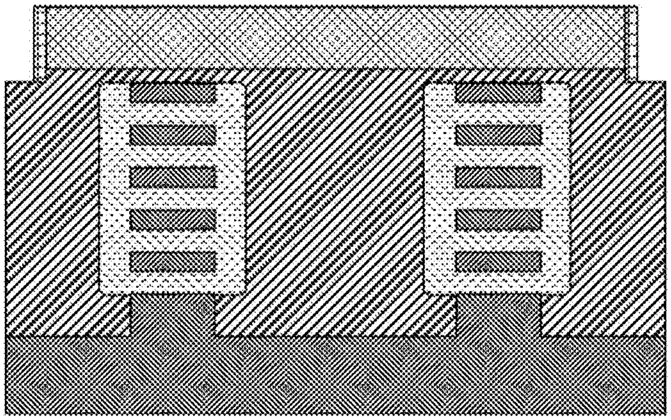
Figure 10C:
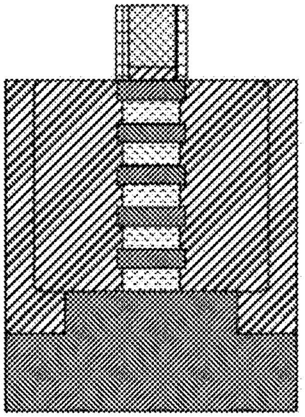

(12) SiGe was selectively etched through isotropic etching. An etching depth was the same as a thickness of the gate spacer structure, as shown in FIG. 10.

Figure 11A:
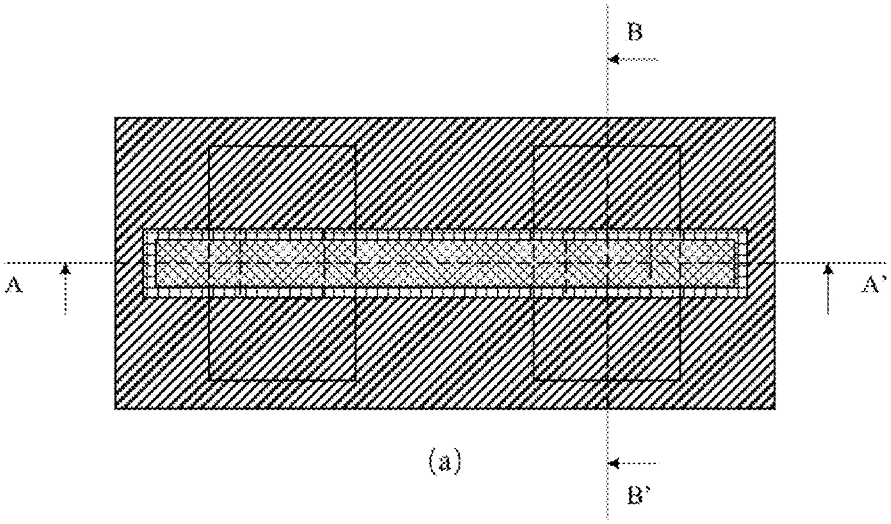
FIGS. 11*a-c* schematically show deposition the inner-spacer material followed by etching to form the inner spacer.
Figure 11B:
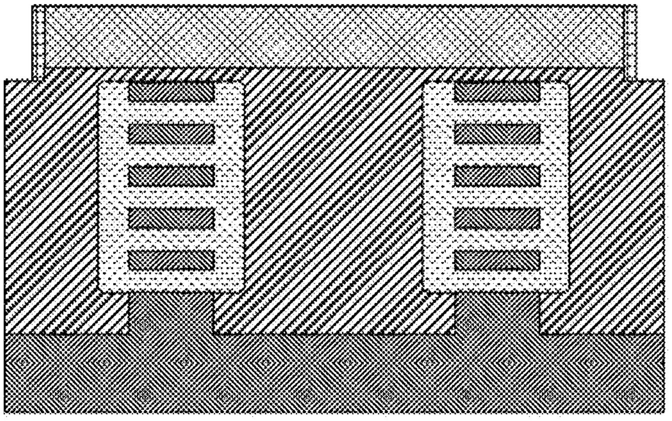
Figure 11C:
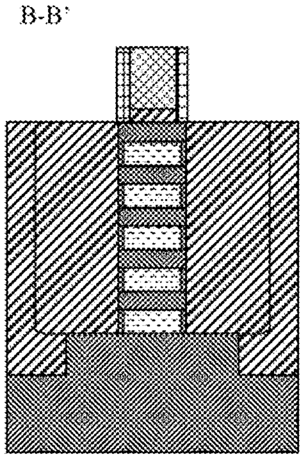

(13) A SiOC layer was isotropically grown on the inner gate spacer structure by using atomic layer deposition (ALD). Exposed SiOC was removed by etching to form inter gate spacer structure, as shown in FIG. 11.

Figure 12A:
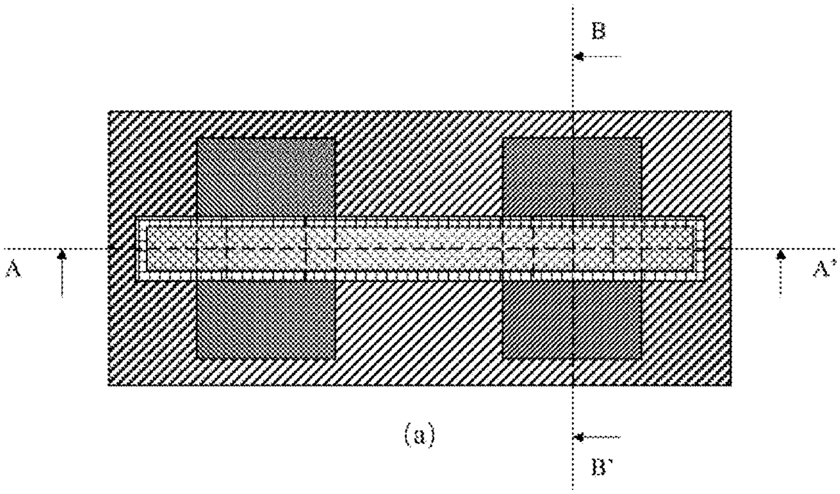
FIGS. 12*a-c* schematically show in-situ doping epitaxy to form source and drain.
Figure 12B:
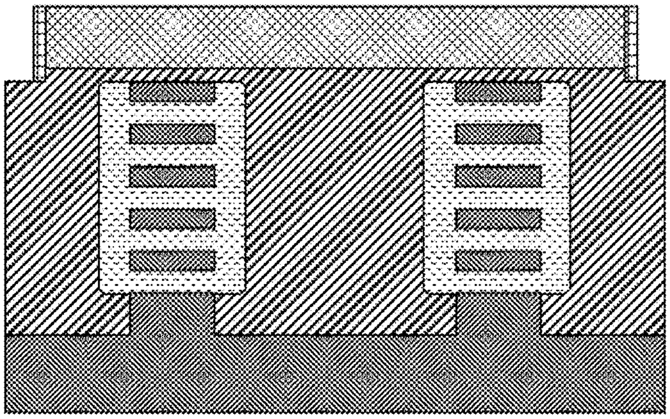
Figure 12C:
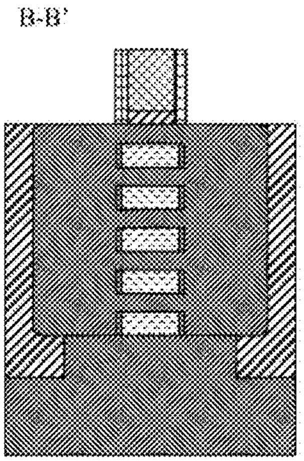

(14) Source and drain were formed by in-situ doping and epitaxy. SiC or Si material were subjected to epitaxy on a negative-channel metal-oxide-semiconductor. SiGe material epitaxy was performed on positive-channel metal-oxide-semiconductor (PMOS), as shown in FIG. 12.

Figure 13A:
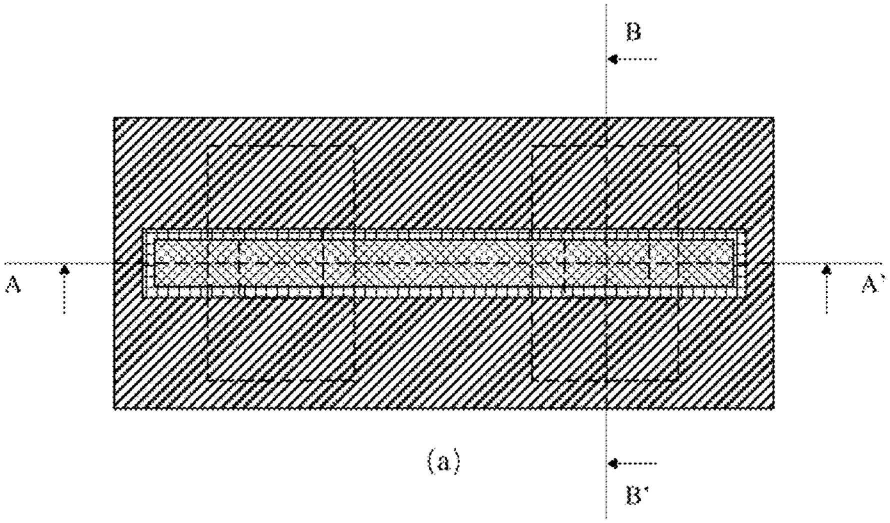
FIGS. 13*a-c* schematically show deposition of interlayer dielectric followed by chemical mechanical polishing (CMP) to expose the dummy-gate material.
Figure 13B:
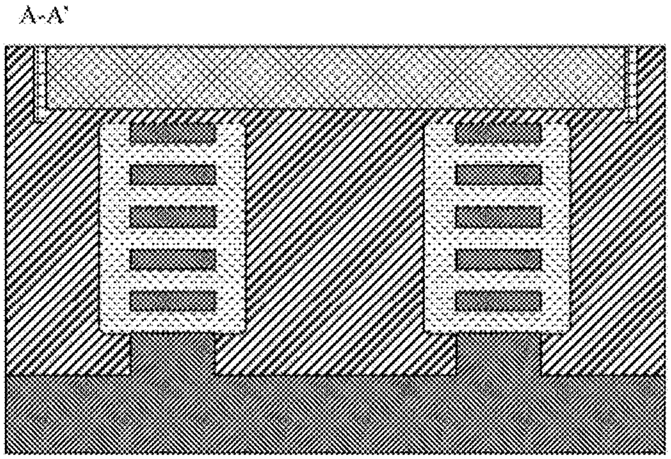
Figure 13C:
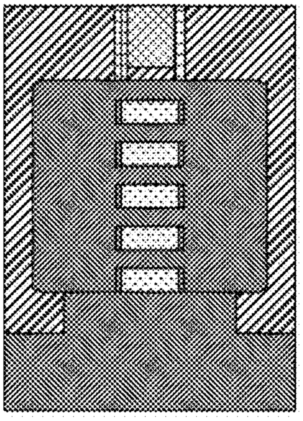

(15) A $SiO_2$ layer was deposited by PECVD, and then subjected to CMP to expose the a-Si dummy gate, as shown in FIG. 13.

Figure 14A:
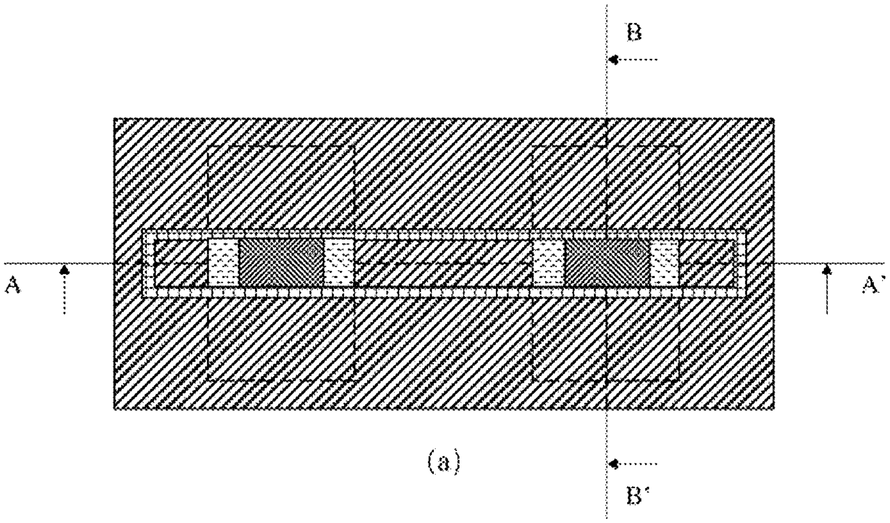
FIGS. 14*a-c* schematically show removal of the dummy-gate material and dielectric material under dummy-gate material the by isotropic etching.
Figure 14B:
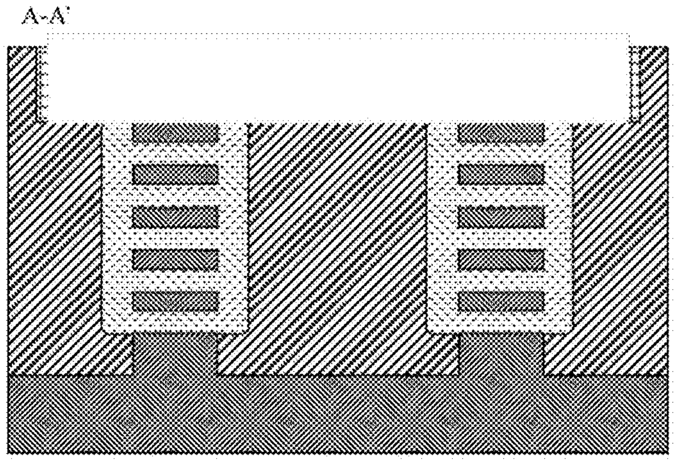
Figure 14C:
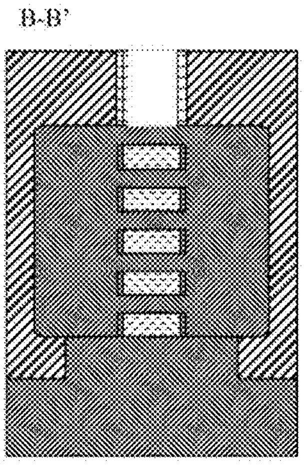

(16) The a-Si dummy gate and $SiO_2$ layer at the bottom of the dummy gate were selectively removed with tetramethylammonium hydroxide (TMAH), as shown in FIG. 14.

Figure 15A:
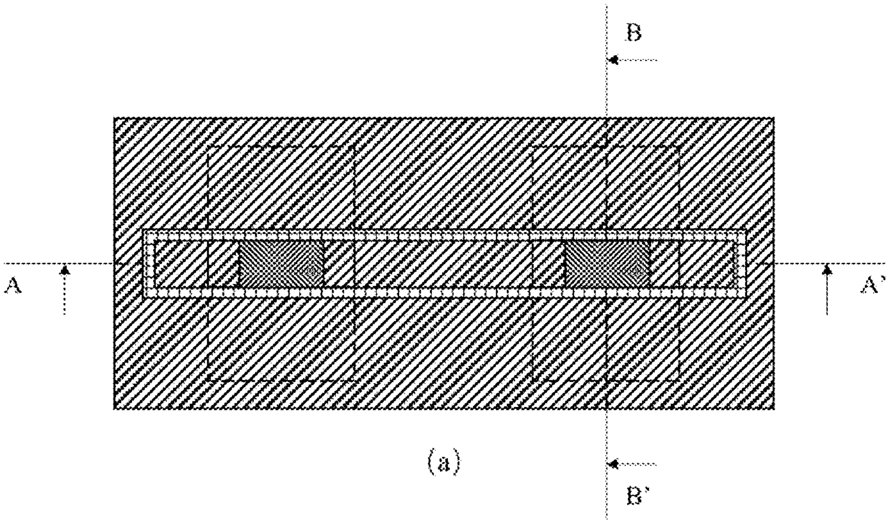
FIGS. 15*a-c* schematically show selective removal of the remaining SiGe to release the channel.
Figure 15B:
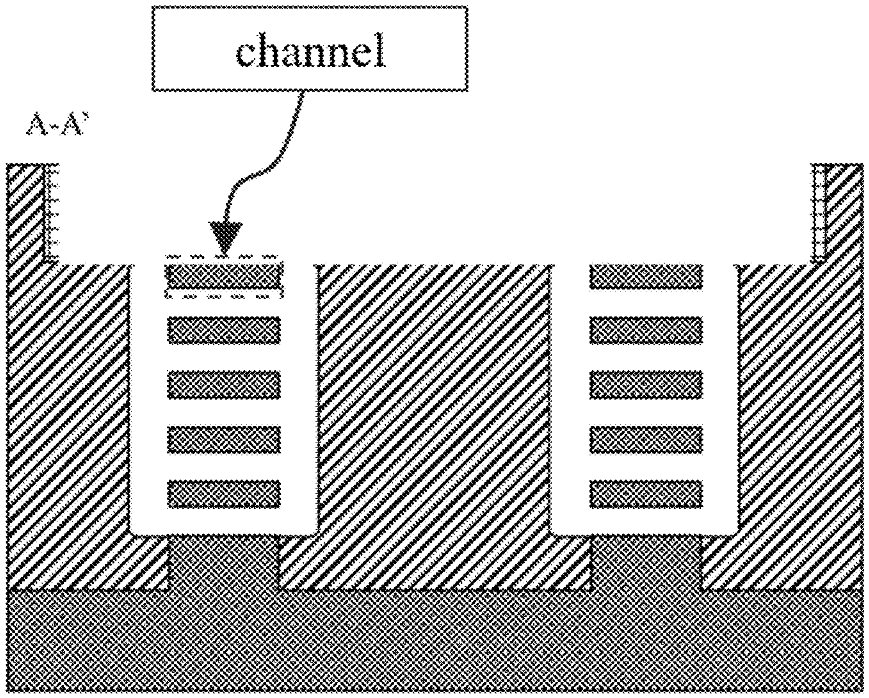
Figure 15C:
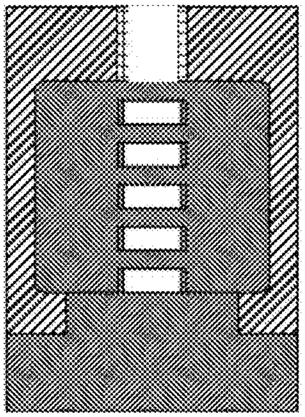

(17) The remaining SiGe was removed by isotropic etching to release the channel, as shown in FIG. 15.

Figure 16A:
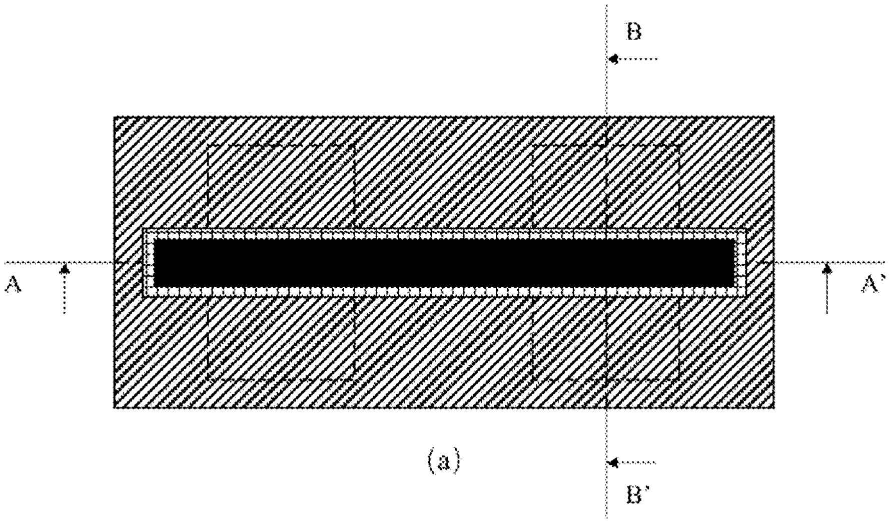
FIGS. 16*a-c* schematically show sequential deposition of high-k (HK) dielectric material, work function metal and gate metal material.
Figure 16B:
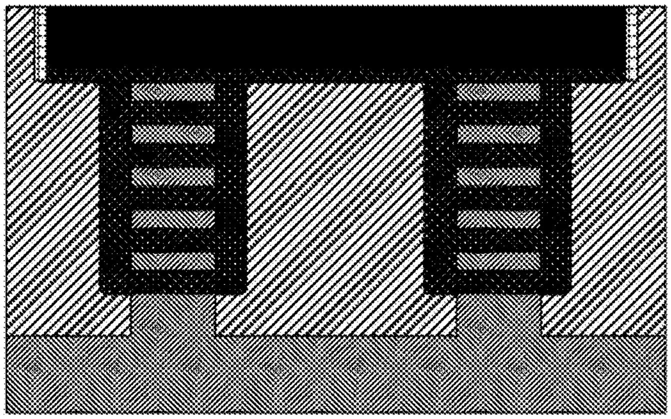
Figure 16C:
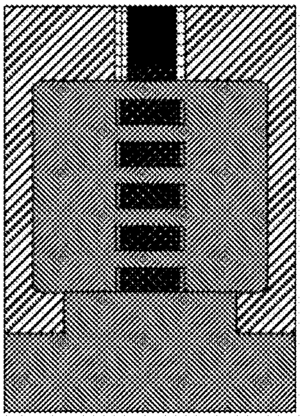

(18) Hafnium (IV) oxide ($HfO_2$), NMOS work function metal (WFM), PMOS work function metal (WFM) and metallic tungsten (W) were sequentially deposited by ALD, as shown in FIG. 16;

(19) A $SiO_2$ layer (200 nm) was deposited by PECVE, and then subjected to CMP to form an interlayer dielectric.

(20) A gate-end contact hole, a source-end contact hole, a drain-end contact hole and a bulk-end contact hole were formed.

(21) The gate-end contact hole, the source-end contact hole, the drain-end contact hole and the bulk-end contact hole were filled with Metal 0 by sputtering.

Figure 17A:
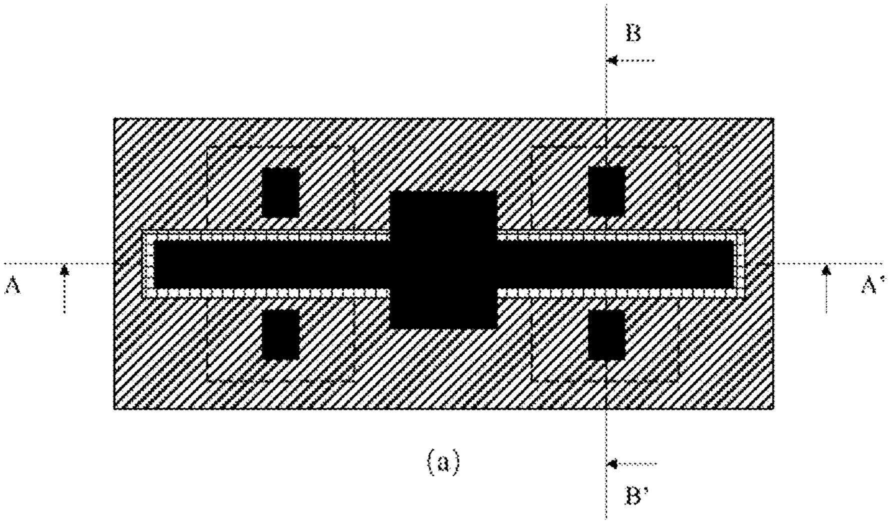
FIGS. 17*a-c* schematically show formation of the contact hole V0 by photoetching, and filling of the contact hole V0 with Metal 0 followed by CMP to isolate a conductive layer of the device.
Figure 17B:
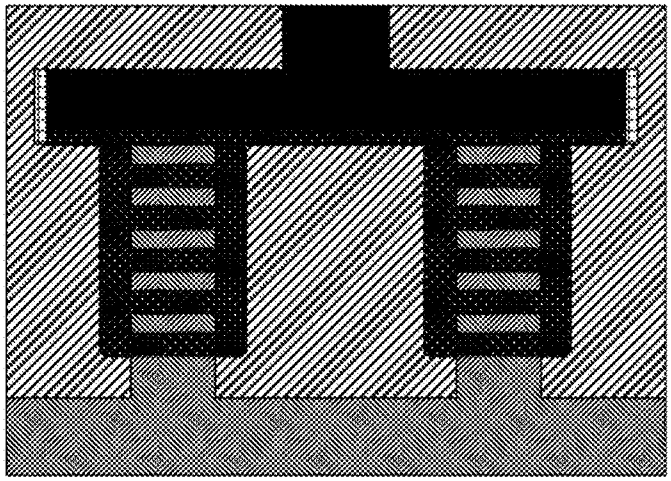
Figure 17C:
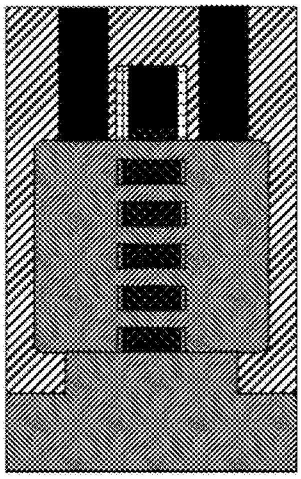

(22) The Metal 0 was subjected to CMP to separate the conductive layers of the devices to achieve the isolation effect, as shown in FIG. 17.

(23) Back-end-of-line process (BEOL) (including through-hole fabrication, metal deposition and metal wire etching) was performed to complete device integration.

Figure 18:
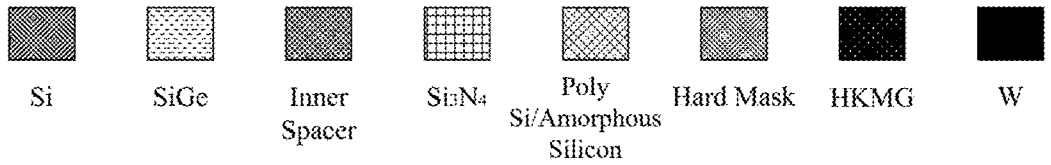
FIG. 18 explains graphic symbols in FIGS. 1-17.

Graphic symbols in FIGS. 1-17 are explained in FIG. 18.

The above embodiments are merely illustrative of this application, and are not intended to limit this application. It should be understood that various changes, modifications and variations made by those skilled in the art to the above embodiments without departing from the spirit of the application should fall within the scope of the disclosure defined by the appended claims.

What is claimed is:

1. A method for fabricating a gate-all-around (GAA) structure, comprising:

(A) forming a silicon germanium (SiGe)/silicon (Si) periodic superlattice laminate on a substrate;

(B) forming at least two active regions on the SiGe/Si periodic superlattice laminate by patterning;

(C) forming an isolation structure between the at least two active regions;

(D) performing selective epitaxy growth of a SiGe layer on the at least two active regions prior to formation of a source-drain structure to form a SiGe-wrapped stacked structure; wherein the SiGe layer is a single-crystal SiGe layer grown, by the selective epitaxy growth, on surfaces of Si layers and SiGe layers of the SiGe/Si periodic superlattice laminate; and wherein the SiGe layer and a SiGe superlattice in the SiGe/Si periodic superlattice laminate have the same germanium (Ge) content;

(E) depositing a layer of a first dielectric material on the at least two active regions, wherein a thickness of the layer of the first dielectric material is greater than a height of the at least two active regions, and polishing a top of the layer of the first dielectric material;

(F) forming a dummy gate pattern on the top of the layer of the first dielectric material through steps of:

(F1) depositing a dummy-gate material on the top of the layer of the first dielectric material, wherein a ratio of an etch rate of the dummy-gate material to an etch rate of Si and SiGe in dry etching or wet etching is greater than 5:1; and (F2) defining the dummy-gate pattern by photoetching and etching; wherein a width of the dummy-gate pattern defines a gate length of a nanosheet device;

(G) performing doping in a source-drain extension region through steps of:

(G1) taking the dummy-gate pattern as a mask, removing the first dielectric material exposed on a top of the at least two active regions by anisotropic etching; and (G2) taking the dummy-gate pattern as the mask, performing doping and activation in the source-drain extension region of the at least two active regions;

(H) forming a gate spacer structure through steps of:

(H1) isotropically depositing a layer of a second dielectric material; and (H2) performing maskless etching through anisotropic etching to form the gate spacer structure on each side of the dummy-gate pattern;

(I) performing source-drain etch back through steps of:

(I1) depositing a layer of a third dielectric material as an etching mask to protect the dummy gate and the gate spacer structure;

(I2) exposing a source-drain etch-back window by photoetching;

(I3) removing exposed SiGe/Si periodic superlattice laminate by anisotropic etching to complete the etch back of the source and the drain; and (I4) removing the third dielectric material;

(J) forming an inner spacer through steps of:

(J1) selectively etching the SiGe layer by isotropic etching, wherein an etching depth of the SiGe layer is equal to a thickness of the gate spacer structure;

(J2) isotropically depositing a layer of a fourth dielectric material; wherein a thickness of the layer of the fourth dielectric material is greater than the etching depth of the SiGe layer; and (J3) removing exposed parts of the layer of the fourth dielectric material by anisotropic etching to form the inner spacer;

(K) forming the source-drain structure by selective epitaxy and in-situ doping;

(L) depositing a first interlayer dielectric material, and exposing the dummy gate through chemical mechanical polishing (CMP);

(M) removing a dummy gate;

(N) after the source-drain structure has been formed, removing the remaining SiGe layer in a gate region exposed by removal of the dummy gate such that the entire SiGe-wrapped stacked structure is removed to release a channel, and removing the remaining SiGe laminate in the silicon germanium (SiGe)/silicon (Si) periodic superlattice laminate;

(O) forming a high-k metal gate (HKMG);

(P) depositing a second interlayer dielectric material, and performing perforation; and filling Metal 0 by sputtering; and (Q) performing a back-end-of-line (BEOL) process to complete device integration.

2. The method of claim 1, wherein step (B) is performed through steps of:

(B1) depositing a layer of a hard mask material;

(B2) patterning the layer of the hard mask material by photoetching to form a pattern whose shape and size respectively defines a shape and a size of each of the at least two active regions; and (B3) etching the SiGe/Si periodic superlattice laminate and the substrate by anisotropic etching to form the at least two active regions;

wherein a ratio of an etch rate of the hard mask material in step (B2) to an etch rate of Si and SiGe is greater than 5:1.

3. The method of claim 2, wherein step (E) is performed through steps of:

(E1) removing the hard mask material;

(E2) depositing the layer of the first dielectric material on the at least two active regions, wherein a thickness of the layer of the first dielectric material is greater than a height of the at least two active regions;

(E3) polishing the layer of the first dielectric material by CMP; and (E4) reducing the thickness of the layer of the first dielectric material by anisotropic etching, wherein the thickness of the layer of the first dielectric material is always kept greater than the height of the at least two active regions.

4. The method of claim 1, wherein steps (M)-(O) are performed through steps of:

selectively removing an exposed part of the dummy gate and a polished layer of the first dielectric material at a bottom thereof;

selectively removing an exposed part of the SiGe layer; and isotropically depositing a gate dielectric material, a work-function metal and a gate metal material sequentially.

5. The method of claim 1, wherein the substrate is a bulk-silicon substrate or a silicon-insulator-silicon (SOI) substrate.

6. The method of claim 1, wherein in step (A), individual $Si_{1-x}Ge_x$ layers in the SiGe/Si periodic superlattice laminate have the same x value.

7. The method of claim 5, wherein in step (C), for the bulk-silicon substrate, the isolation structure is formed by combination of well and shallow trench; and for the SOI substrate, the isolation structure is formed by shallow trench.

8. The method of claim 1, wherein in step (P), the Metal 0 is tungsten (W) or copper (Cu).

9. The method of claim 1, wherein in step (O), the method further comprises:

depositing sequentially Hafnium (IV) oxide ($HfO_2$), NMOS work function metal (WFM), PMOS work function metal (WFM) and metallic tungsten (W) by ALD into the channel.

10. The method of claim 1, wherein in step (D), an entire circumferential side surface of the SiGe/Si periodic superlattice laminate is covered by the SiGe layer, an upper surface of the SiGe/Si periodic superlattice laminate is covered by an etching hard mask, and a lower surface of the SiGe/Si periodic superlattice laminate is attached to the substrate, such that the SiGe layer, the etching hard mask, and the substrate cooperate to surround the SiGe/Si periodic superlattice laminate.

11. The method of claim 3, wherein in step (E4), the thickness of the layer of the first dielectric material is reduced such that a distance between a surface of the layer of the first dielectric material and a surface of the SiGe/Si periodic superlattice laminate is about 10 nm.

12. The method of claim 1, wherein in step (K), for a negative-channel metal-oxide-semiconductor (NMOS) device, the source-drain structure is formed by epitaxy of SiC or Si; and for a positive-channel metal-oxide-semiconductor (PMOS) device, the source-drain structure is formed by epitaxy of SiGe.

13. The method of claim 4, wherein in step of selectively removing the exposed part of the dummy gate and the polished layer of the first dielectric material at the bottom thereof, the exposed part of the dummy gate and the polished layer of the first dielectric material at the bottom thereof are selectively removed with tetramethylammonium hydroxide (TMAH); and wherein in step (N), the remaining SiGe layer and the remaining SiGe laminate are removed by isotropic etching to release the channel.

* * * * *